United States Patent
Carlson

(10) Patent No.: US 10,489,545 B2
(45) Date of Patent: Nov. 26, 2019

(54) INTEGRATED CIRCUIT IMAGING, RENDERING AND LAYOUT EDITING SYSTEM AND METHOD

(71) Applicant: TechInsights Inc., Ottawa, Ontario (CA)

(72) Inventor: Dale Carlson, Stittsville (CA)

(73) Assignee: TECHINSIGHTS INC., Ottawa, Ontario (CA)

( * ) Notice: Subject to any disclaimer, the term of this patent is extended or adjusted under 35 U.S.C. 154(b) by 196 days.

(21) Appl. No.: 15/809,830

(22) Filed: Nov. 10, 2017

(65) Prior Publication Data

US 2018/0144081 A1    May 24, 2018

Related U.S. Application Data

(60) Provisional application No. 62/426,188, filed on Nov. 23, 2016.

(51) Int. Cl.
   *G06F 9/455*   (2018.01)
   *G06F 17/50*   (2006.01)
   *G06T 7/00*    (2017.01)

(52) U.S. Cl.
   CPC ...... *G06F 17/5068* (2013.01); *G06F 17/5081* (2013.01); *G06T 7/0002* (2013.01); *G06T 2207/30148* (2013.01)

(58) Field of Classification Search
   USPC .................................................. 716/111, 132
   See application file for complete search history.

(56) References Cited

U.S. PATENT DOCUMENTS

| | | | | |
|---|---|---|---|---|
| 6,738,953 | B1* | 5/2004 | Sabharwal | G06F 17/5022 716/103 |
| 7,394,288 | B1* | 7/2008 | Agarwal | G06F 15/7867 326/39 |
| 2009/0024974 | A1* | 1/2009 | Yamada | G06F 17/5036 716/113 |
| 2013/0346931 | A1* | 12/2013 | Murakawa | G06F 17/5068 716/108 |
| 2014/0181771 | A1* | 6/2014 | Sajid | G06F 17/5081 716/113 |
| 2014/0282325 | A1* | 9/2014 | Chen | G06F 17/5081 716/111 |

* cited by examiner

*Primary Examiner* — Brian Ngo
(74) *Attorney, Agent, or Firm* — Knobbe, Martens, Olson & Bear, LLP

(57) ABSTRACT

Described are various embodiments of a system and method for verifying extracted integrated circuit (IC) features representative of a source IC and stored in a feature dataset structure. Generally, a set of extracted IC features imaged within a designated IC area is converted into a static tile image. The static tile image is then rendered for visualization as an interactive mapping of the feature dataset structure within the area. Corrections for one or more of the set of extracted IC features are received based on the static tile image and input corrections are executed on the feature dataset structure to produce an updated feature dataset structure.

29 Claims, 4 Drawing Sheets

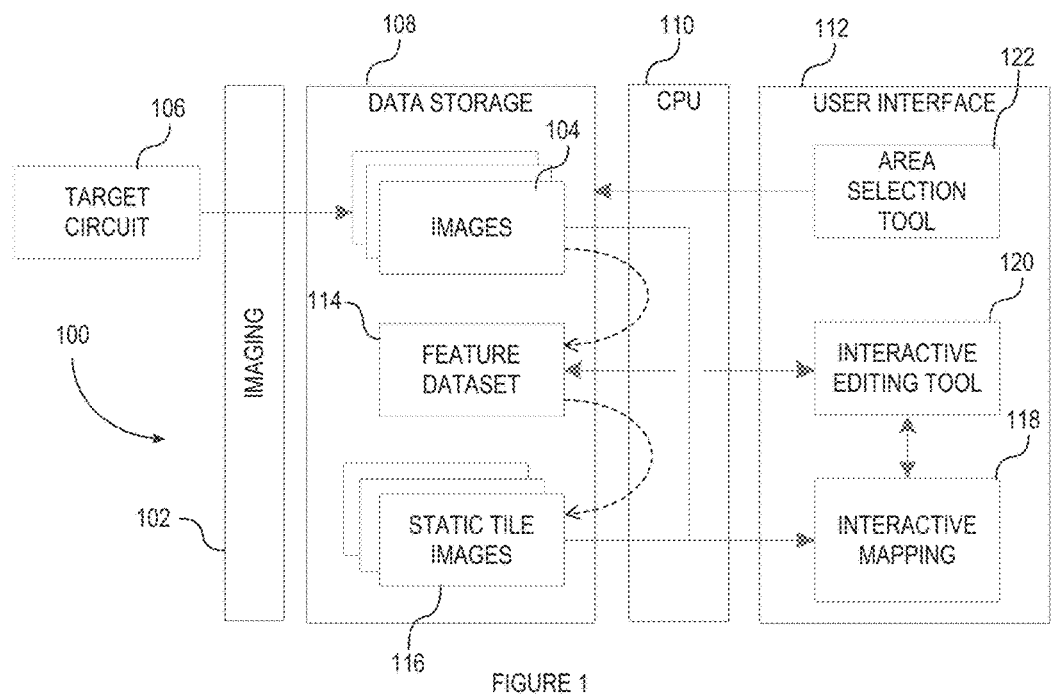
FIGURE 1
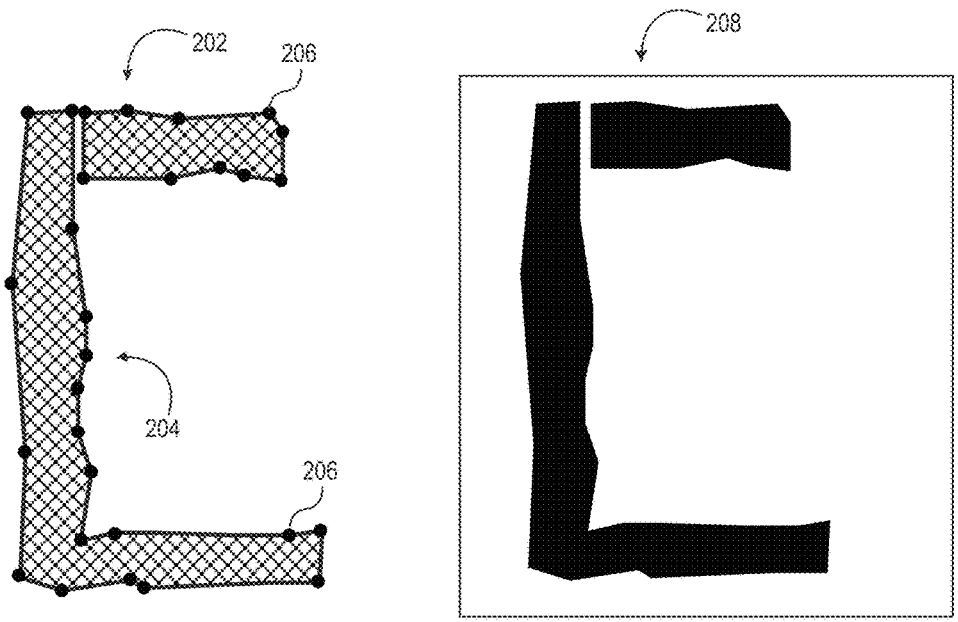
FIGURE 2A
FIGURE 2B

INTEGRATED CIRCUIT IMAGING, RENDERING AND LAYOUT EDITING SYSTEM AND METHOD

CROSS REFERENCE TO RELATED APPLICATIONS

This application claims priority to U.S. Provisional Patent Application No. 62/426,188 filed on Nov. 23, 2016. The disclosure of this prior application is incorporated herein by reference in its entirety and should be considered part of this specification.

FIELD OF THE DISCLOSURE

The present disclosure generally relates to integrated circuits, and in particular, to an integrated circuit imaging, rendering and layout editing system and method.

BACKGROUND

Integrated circuit (IC) design generally involves rendering a particular IC layout as a series of polygons outlining various IC features and interconnections. Various IC design tools are available to assist in defining these features and functions and storing them in a standardized format such as in a GDSII database file format, which consists of a binary file format representing planar geometric shapes, text labels, and other information about the layout in hierarchical form. The structured and 3D layered layout can then be used to map out and manufacture the IC.

To reverse engineer a particular IC layout, sequential images of the IC are taken and mosaicked, layer-by-layer, and processed to digitally reconstruct the IC layout. Automated IC feature extraction tools have been developed to automatically identify IC features and connections from these images and progressively reconstruct IC layout polygons, which may again be represented and stored in a standardized format such as in a GDSII database file format. However, as source IC imaging, mosaicking, and layering generally yields certain inaccuracies and imprecisions when automatically processed for feature extraction, manual and/or semi-automated post-processing is generally required to address misalignments, missed connections, artefacts and errors, for example, which may be expected when working from source images rather than a known layout design.

In current implementations, such manual or semi-automated processes can be executed by a team working in parallel on different regions of interest, whereby corrected polygons in any given region may predictably impact identified polygons in other related regions and/or layers such that polygon corrections are generally propagated on-the-fly throughout the layout by reprocessing the entire layout polygon data. For increasingly large and complex polygon data structures representative of increasingly complex and dense IC designs, the on-the-fly propagation of polygon corrections/adjustments, particularly across a team working in parallel on a same reverse engineered design layout, can draw significant processing resources and lead to significant if not prohibitive lag time between iterations.

This background information is provided to reveal information believed by the applicant to be of possible relevance. No admission is necessarily intended, nor should be construed, that any of the preceding information constitutes prior art or forms part of the general common knowledge in the relevant art.

SUMMARY

The following presents a simplified summary of the general inventive concept(s) described herein to provide a basic understanding of some aspects of the invention. This summary is not an extensive overview of the invention. It is not intended to restrict key or critical elements of the invention or to delineate the scope of the invention beyond that which is explicitly or implicitly described by the following description and claims.

A need exists for an integrated circuit imaging, rendering and layout editing system and method that overcome some of the drawbacks of known techniques, or at least, provides a useful alternative thereto. Some aspects of this disclosure provide examples of such systems and methods.

In accordance with one aspect, there is provided a computer-implemented method for verifying extracted integrated circuit (IC) features representative of a source IC and stored in a feature dataset structure, the method comprising: converting, from the feature dataset structure, a set of extracted IC features imaged within a designated IC area into a static tile image of the set representative of the area; rendering the static tile image for visualization as an interactive mapping of the feature dataset structure within the area; receiving input corrections for one or more of the set of extracted IC features based on the static tile image; and executing the input corrections on the feature dataset structure to produce an updated feature dataset structure.

In one embodiment, the method further comprises, prior to the converting: imaging the source IC to output a source IC image; automatically extracting a plurality of IC features from the source IC image; and storing respective representations of each of the extracted IC features in the feature dataset structure.

In one embodiment, the converting comprises converting respective sets of the extracted IC features imaged within juxtaposed areas into corresponding juxtaposable static tile images; and the rendering and the receiving are executed as a function of the corresponding static tile images.

In one embodiment, adjacent ones of the juxtaposable static tile images are selectively mosaicked to render a combined interactive mapping.

In one embodiment, each of the corresponding static tile images is stored at multiple mapping resolutions such that, for a selected IC mapping area and resolution, corresponding ones of the juxtaposable static tile images are mosaicked to render the combined interactive mapping for the area at the mapping resolution.

In one embodiment, lower resolution tile images are constrained by virtue of their selected resolution to detail only larger scale IC features, whereas higher resolution tile images detail smaller scale IC features, and wherein the rendering comprises selectively rendering the interactive mapping at a selected resolution so to selectively constrain the rendering to the larger scale IC features.

In one embodiment, the method further comprises converting the updated feature dataset into an updated static tile image and rendering the updated static tile image for further visualization as an updated interactive mapping of the updated feature dataset.

In one embodiment, the input corrections are interactively input via the interactive mapping.

In one embodiment, the extracted IC features are stored as polygons in the feature dataset structure, and wherein the static tile image is representative of the polygons in the area.

In one embodiment, the static tile image is colour coded as a function of at least one IC feature characteristic stored against the extracted IC features in the feature dataset structure.

In one embodiment, the at least one feature characteristic comprises an extracted feature layer identifier representative of a designated imaged IC layer.

In one embodiment, the at least one feature characteristic comprises a power connection identified for at least some of the extracted IC features.

In one embodiment, the converting comprises generating a bitmap image representative of the extracted IC features in the area;

In one embodiment, the bitmap image is subsequently colour-coded as a function of at least one feature characteristic stored against the extracted IC features in the area.

In one embodiment, the rendering comprises at least partially transparently overlaying the static tile image onto a corresponding source IC image area such that the source IC image area is at least partially visible through the mapping.

In accordance with another aspect, there is provided an integrated circuit (IC) extraction verification system comprising: a user-interactive digital image display; a data processor; and a data storage accessible to the data processor, the data storage having stored therein: a feature dataset structure for storing extracted IC features representative of a source IC; and statements and instructions executable by the processor to: convert, from the feature dataset structure, a set of extracted IC features imaged within a designated IC area into a static tile image of the set representative of the area; render, on the display, the static tile image for visualization as an interactive mapping of the feature dataset structure within the area; receive input corrections for one or more of the set of extracted IC features based on the static tile image; and execute the input corrections on the feature dataset structure to produce an updated feature dataset structure.

In one embodiment, the statements and instructions are further executable to convert respective sets of the extracted IC features imaged within juxtaposed areas into corresponding juxtaposable static tile images.

In one embodiment, adjacent ones of the juxtaposable static tile images are selectively mosaicked to render a combined interactive mapping.

In one embodiment, each of the corresponding static tile images is stored at multiple mapping resolutions such that, for a selected IC mapping area and resolution, corresponding ones of the juxtaposable static tile images are mosaicked to render the combined interactive mapping for the area at the mapping resolution.

In one embodiment, the lower resolution tile images are constrained by virtue of their selected resolution to detail only larger scale IC features, whereas higher resolution tile images detail smaller scale IC features, and wherein the statements and instructions are further executable to selectively render the interactive mapping at a selected resolution so to selectively constrain the rendering to the larger scale IC features.

In one embodiment, the statements and instructions are further executable to convert the updated feature dataset into an updated static tile image and render the updated static tile image for further visualization as an updated interactive mapping of the updated feature dataset.

In one embodiment, the input corrections are interactively captured via a user interface to the interactive mapping.

In one embodiment, the extracted IC features are stored as polygons in the feature dataset structure, and wherein the static tile image is representative of the polygons in the area.

In one embodiment, the static tile image is colour coded as a function of at least one IC feature characteristic stored against the extracted IC features in the feature dataset structure.

In one embodiment, the at least one feature characteristic comprises an to extracted feature layer identifier representative of a designated imaged IC layer.

In one embodiment, the at least one feature characteristic comprises a power connection identified for at least some of the extracted IC features.

In one embodiment, the static tile image is a bitmap image representative of the extracted IC features in the area;

In one embodiment, the statements and instructions are further executable to colour-code the bitmap image as a function of at least one feature characteristic stored against the extracted IC features in the area.

In one embodiment, the statements and instructions are further executable to at least partially transparently overlay the static tile image onto a corresponding source IC image area such that the source IC image area is at least partially visible through the mapping.

In accordance with another aspect, there is provided a non-transitory computer-readable medium having statements and instructions stored thereon for execution by a processor to implement an integrated circuit (IC) feature extraction verification application by: converting, from a stored feature dataset structure, a set of extracted IC features imaged within a designated IC area into a static tile image of the set representative of the area; rendering, on an interactive digital display, the static tile image for visualization as an interactive mapping of the feature dataset structure within the area; receiving input corrections for one or more of the set of extracted IC features based on the static tile image; and executing the input corrections on the feature dataset structure to produce an updated feature dataset structure.

In one embodiment, the converting comprises converting respective sets of the extracted IC features imaged within juxtaposed areas into corresponding juxtaposable static tile images; and the rendering and the receiving are executed as a function of the corresponding static tile images.

In one embodiment, adjacent ones of the juxtaposable static tile images are selectively mosaicked to render a combined interactive mapping; and each of the corresponding static tile images is stored at multiple mapping resolutions such that, for a selected IC mapping area and resolution, corresponding ones of the juxtaposable static tile images are mosaicked to render the combined interactive mapping for the area at the mapping resolution.

In one embodiment, lower resolution tile images are constrained by virtue of their selected resolution to detail only larger scale IC features, whereas higher resolution tile images detail smaller scale IC features, and wherein the rendering comprises selectively rendering the interactive mapping at a selected resolution so to selectively constrain the rendering to the larger scale IC features.

In one embodiment, the statements and instructions are further executable to convert the updated feature dataset into an updated static tile image and rendering the updated static tile image for further visualization as an updated interactive mapping of the updated feature dataset.

In one embodiment, the extracted IC features are stored as polygons in the feature dataset structure, and wherein the static tile image is representative of the polygons in the area.

In one embodiment, the rendering comprises at least partially transparently overlaying the static tile image onto a corresponding source IC image area such that the source IC image area is at least partially visible through the mapping.

In accordance with another aspect, there is provided a computer-implemented method for rendering an image defined by a vectorized feature dataset at different magnifications, the method comprising: converting, for each given image rendering magnification, respective subsets of the vectorized feature dataset located within juxtaposed image areas into correspondingly juxtaposable static tile images of the respective subsets, wherein a resolution of each of the static tile images is prescribed by the given image rendering magnification; receiving selection of a selected image rendering magnification and selected image area; retrieving the static tile images corresponding to the selected image rendering magnification and selected image area; and rendering the retrieved static tile images for visualization of the selected image area at the selected image rendering magnification.

In one embodiment, lower magnification tile images are constrained by virtue of their associated magnification to detail only larger scale features, whereas higher magnification tile images detail smaller scale features, and wherein the rendering comprises selectively rendering the selected image area at a relatively higher selected magnification so to selectively constrain the rendering to the larger scale features.

In one embodiment, the vectorized features are stored as polygons, and wherein the static tile images are representative of the polygons.

In one embodiment, the converting comprises generating a bitmap image representative of the vectorized features in the given area.

In one embodiment, the rendering comprises rendering the retrieved static tile images for visualization as an interactive mapping of the feature dataset structure within the area.

In one embodiment, the method further comprises: receiving input corrections for one or more given features based on the static tile images; and executing the input corrections on the feature dataset to produce an updated feature dataset.

Other aspects, features and/or advantages will become more apparent upon reading of the following non-restrictive description of specific embodiments thereof, given by way of example only with reference to the accompanying drawings.

BRIEF DESCRIPTION OF THE FIGURES

Several embodiments of the present disclosure will be provided, by way of examples only, with reference to the appended drawings, wherein:

FIG. 1 is a diagram of an integrated circuit (IC) imaging, rendering and layout editing system, in accordance with one embodiment;

FIG. 2A is a simplified diagram of an automatically extracted IC image feature dataset represented by output polygons, in accordance with one embodiment;

FIG. 2B is a diagram of a static tile image representative of the extracted feature dataset depicted in FIG. 2A and automatically converted therefrom for visualization as an interactive mapping thereof.

FIG. 5A is another exemplary screenshot of an automatically extracted IC circuit layout image in which each imaged circuit line is represented by an average of 60 polygon vertices due to inherent data extraction imperfections common in a reverse engineering environment and resulting in significantly increased IC layout feature rendering loads, whereas

DETAILED DESCRIPTION

Figure 3:
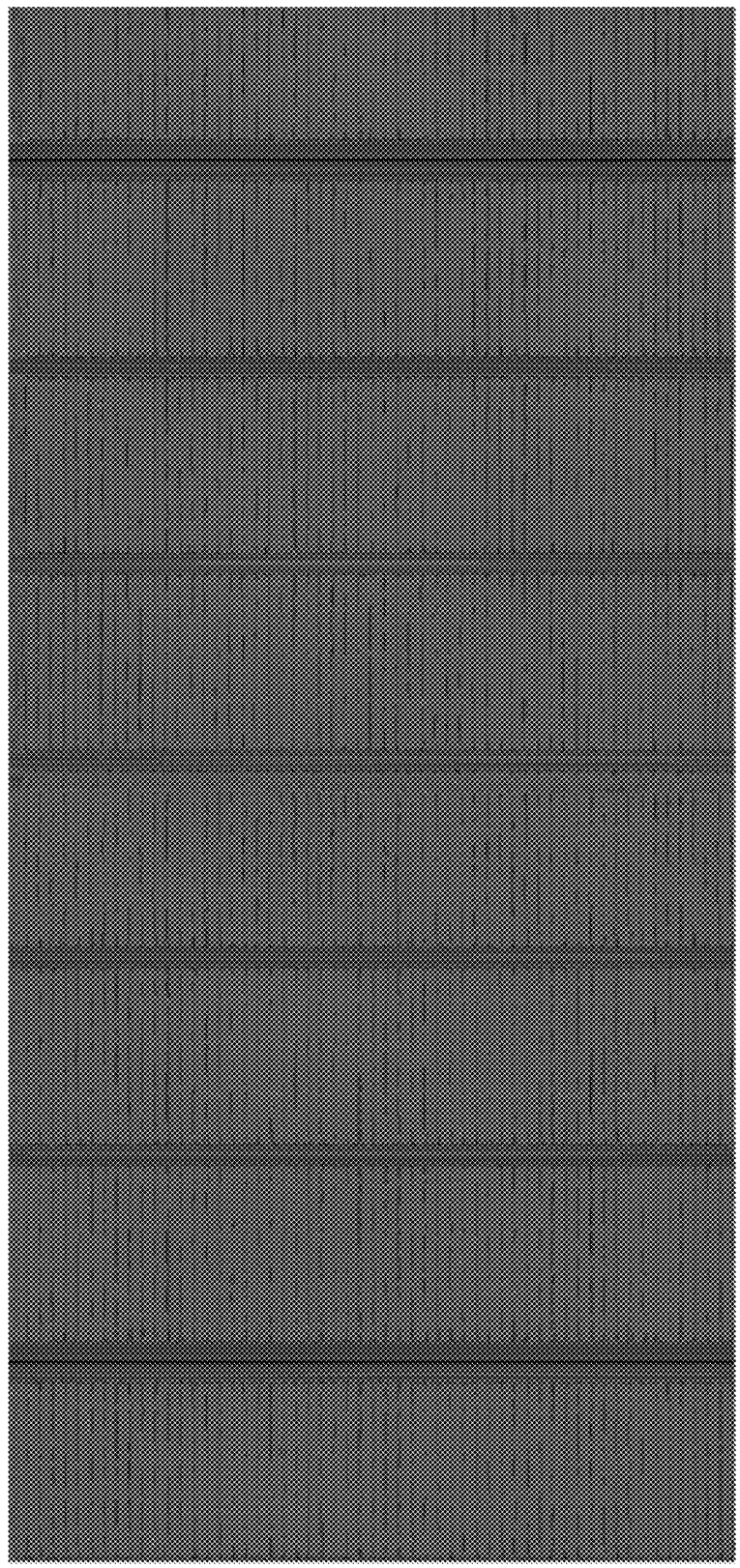
FIG. 3 is an exemplary screenshot of an automatically extracted IC circuit layout image consisting of over 11500 polygons representing about 1.9 MB of stored data.

The systems and methods described herein provide, in accordance with different embodiments, different examples of an integrated circuit imaging, rendering and layout editing system and method that yield, for instance, improved IC reverse engineering throughput, efficiency and reduced lag times. For example, in one embodiment, errors, inaccuracies and/or misalignments identifiable in an extracted IC feature dataset can be more readily and efficiently addressed and propagated throughout the IC layout data structure without adversely affecting overall layout processing efficiency, throughput and correction lag times.

In one such example, feature extraction verifications in a given area of interest can be executed on an interactive extracted IC feature mapping of this area, which may be, for example, rendered to overlay a corresponding IC image of the IC area of interest. For example, an extracted feature dataset for a given area can first be converted or otherwise translated into a static tile image representative of the extracted features in that area, optionally with associated labeling and/or colour coding embedded therein, thereby reducing an overall screen rendering load on the system when seeking to visualize extracted features in that area. This static tile image can be dynamically linked with the extracted feature dataset so to be used as an interactive mapping of the extracted features, particularly when optionally rendered to overlay a corresponding source imaging of the IC in that area (i.e. the IC imaging used to source the feature extraction). Accordingly, the interactive mapping can be used to verify a feature extraction accuracy, and, given its dynamic interface to the underlying feature dataset, further used to guide source corrections thereto (e.g. identify misconnections, missed connections, misalignments, artefacts, staggered or otherwise noisy extracted polygon line outputs, etc.). Such corrections to the source dataset can then be propagated throughout the extracted layout architecture and used downstream to produce updated static tile images and mappings of the extracted IC layout dataset for further verification, revision and/or editing as need be. Using this approach, the user may act directly to correct or adjust a current feature dataset (e.g. to amend current feature dataset polygons, labels and related annotations/metadata) without unduly impacting a processing load on the system as a whole, for example, which may be concurrently used by a team working in parallel on different areas and/or layers of the extracted feature dataset. Namely, while multiple dataset corrections may be concurrently entered and tracked, these corrections are not immediately conveyed as a screen-rendered output, and in fact, may optionally be batch-compiled and propagated throughout the layout architecture on a scheduled basis so to minimize any lag or downtime during active verification.

Given the nature and expected number of corrections required to improve an accuracy of automatically extracted features, for example, dynamic or on-the-fly feature correction rendering is not required for verifications to be pursued over a given area, and even less so in other connected or layered areas. Accordingly, extracted feature verifications and corrections can be reliably executed in parallel for various areas of interest on the basis of respective static tile images of the extracted features in these areas, each dynamically linked and mapped to the underlying feature dataset sourced to produce these images, thus reducing overall processing loads on the verification system. Batch and scheduled processing of input corrections can also alleviate processing load and reduce lag times without unduly impacting verification efficiency and accuracy.

With reference to FIG. 1, and in accordance with one embodiment, an exemplary integrated circuit (IC) extraction verification system 100 will now be described. In this embodiment, the system generally comprises or is configured to interface with or at least receive for further processing the output of an imaging device 102, such as a scanning electron microscope (SEM), transmission electron microscope (TEM), focused ion beam (FIB) imaging device, atomic force microscope (AFM), optical imaging system such as an optical microscope, camera, flatbed scanner, x-ray and the like, that is used to generally produce a set of images 104 representative of a source IC 106. These images 104 are generally stored in digital form on a data storage device 108 of the system 100 and optionally retrievable via CPU 110 and user interface 112 for visualization. As will be appreciated by the skilled technician, other imaging techniques may also be considered, for example, in the implementation of the herein-described process in other fields, such as in medical imaging, geographic mapping, geologic mapping and the like.

In this particular embodiment, the stored images 104 are automatically processed to extract therefrom a set of IC features representative of the source IC, in this case stored as a feature dataset 114 stored in a conventional data structure such as a GDSII database file format, or again an SQL or other like database format, as will be readily known in the art. The dataset may otherwise or also be stored in memory and/or on a permanent storage device such as a hard or flash drive, and the like, as will be readily appreciated by the skilled artisan. For instance, different imaging, mapping and/or data applications may invoke different source dataset types and storage requirements and/or preferences. Ultimately, the principles considered herein may be applied to different vectorized or like dataset types and/or storage options to improve downstream dataset rendering, editing and/or dynamic updating loads, for example.

With added reference to FIG. 2A, the stored dataset may be illustratively stored as a set of polygons (e.g. see polygons 202 and 204) defined by respective sets of vertices 206 that may be interactively rendered for visualization, and modification as necessary. As will be described in greater detail below, where extracted features may be represented by a limited set of polygon vertices, these extracted polygons may be efficiently rendered without undue system processing loads. However, where data extraction artefacts and imperfections result in a significant increase in automatically generated polygon vertices, rendering loads may increase significantly if not prohibitively. To mitigate burdensome processing loads, the feature dataset is, in this example, further processed to produce a set of static tile images 116 that may be rendered individually and/or mosaicked to depict a selectable area of the imaged IC without need to render each of its constituent polygon vertices. For example, the polygons 202 and 204 shown in FIG. 2A can be converted, as described herein, into the static tile image 208 of FIG. 2B, the latter generally corresponding to a much lower rendering load than the former, particularly as the number of polygons and vertices increase, as will be described and exemplified further below. Furthermore, while the rendering load associated with a given area will vary when rendering polygons based on the number of polygons involved, the size of the static tile images will remain predictably the same based on the predefined static tile image pixel size.

In this particular embodiment, the converted static tiles 116 are rendered as an interactive mapping 118 alongside an interactive feature dataset editing tool 120 such that appropriate corrections may be efficiently applied to the extracted dataset through visualization of the rendered static tile images without necessarily rendering any of the extracted polygons or vertices themselves. For example, the user interface 112 may allow the user to select an IC area for visualization and verification via area selection tool 122, which will invoke the system to retrieve, in this example via CPU 110 and data storage 108, one or more corresponding IC images 104 from the data store, as well as the feature dataset 114 and static tile image(s) 116 corresponding thereto.

To mitigate excessive image rendering loads, the CPU 110 will generate a corresponding interactive mapping 118 consisting of the retrieved static tiles 116, in this example overlaid onto the source IC images 104 to identify possible discrepancies generated during the automated feature extraction process (e.g. feature misalignments; inaccurate feature connections, disconnections and/or misconnections, omissions, artefacts and the like), that are dynamically mapped to the stored feature dataset 114 via interactive editing tool 120. For instance, the user interface may allow the user to navigate the interactive mapping 118 using an interactive cursor, pointer or the like operated against the static tile(s) 116 while tracking a relative position (e.g. static image coordinates) thereof against corresponding polygon vertex coordinates. In doing so, a user may interactively select a particular feature dataset polygon and/or vertex on the static tile image(s) 116 without necessarily having to render this polygon, but rather by dynamically mapping user actions on the static tile(s) 116 against an editable listing of such polygon vertices provided via the editing tool 120.

Since the user is not directly interfacing with live rendering of the stored feature dataset, dataset corrections may be applied directly (e.g. polygon/vertex corrections) without having to immediately render and propagate such corrections throughout the system interface. At any time, however, all or a relevant subset of the static tile images 116 may be regenerated based on one or more input corrections to the feature dataset 114 for visualization, but again, at a much reduced rendering load. Furthermore, as different users may be working on different areas of the feature dataset, different static tile images may be rendered to reflect input corrections at different times without impacting the work of others, even when effectively operating on the same or related features that may span multiple tile images.

In some embodiments, different sets of extracted IC features imaged within juxtaposed areas may be correspondingly converted to juxtaposable static tile images that may thus be mosaicked, as need be, to produce a larger combined area view and dynamic mapping.

Given that verification work done at different image resolutions may generally involve corrections applied to correspondingly sized features, static tile images may be produced at different scales such that smaller features generally unworkable at lower resolutions are not necessarily included in larger, high level tiles, but increasingly included as higher resolution tiles are requested when working on the finer features of the extracted layout. In comparison, when rendering the entire featured dataset for a given area selection irrespective of resolution, it will be appreciated that a significant and often prohibitive increase in rendering load will ensue for large-scale manipulations. Using the approach described herein, scaling factors maybe appropriately invoked to only render features reasonably workable at any given scale and thus minimize the inclusion of fine details for regions exhibiting high feature densities at a given resolution. Accordingly, corresponding static tile images may be stored at multiple mapping resolutions such that, for a selected IC mapping area and resolution, corresponding juxtaposable static tile images can be mosaicked to render an appropriate combined interactive mapping for this area at the selected mapping resolution. As noted above, lower resolution tile images will be constrained by virtue of their selected resolution to detail only larger scale IC features, whereas higher resolution tile images will detail smaller scale IC features.

As will be appreciated by the skilled artisan, while the above contemplates the automated extraction of IC feature dataset polygons, and the conversion thereof to representative static bitmap tile images, other file and image formats may also be considered without departing from the general scope and nature of the present disclosure. For example, and as noted below, while the use of a static bitmap (.bmp) image tile format allows for a direct mapping of image bits to pixels, other static image tile file formats may also be considered, such as .tif, .jpg, .jp2 and the like, without departing from the general scope and nature of the present disclosure, some of which in fact allowing for even further overall processing/rendering load reductions through well known image compression techniques that, in most cases, would not perceptibly impact processing/rendering loads.

Furthermore, while the examples provided herein focus on the provision of an IC feature dataset rendering and editing tool, the image rendering optimization technique considered herein may also be applicable to other applications in which large (vectorized) datasets must be processed for efficient rendering and user interaction, particularly where such datasets are selectively rendered at different resolutions/magnifications in which, for example, high detail levels may be lost or imperceptible and thus unnecessarily rendered for lower magnifications. For example, scalable geographic and/or geological mapping applications may rely on high volume vectorized datasets that, at lower magnifications, need not encompass the full set of vectors to provide the desired visualization. These datasets may also be automatically acquired and/or compiled from various geo-locational imaging techniques that, as in the above IC example, introduce certain imperfections, inaccuracies and/or artefacts that may undesirably increase mapping/rendering loads and that could thus further benefit from the static tile image conversion techniques considered herein. Further, by implementing the approaches considered herein, a (dynamic) mapping may be produced for the entire dataset in a given area without necessarily invoking prohibitive image-rendering loads for low magnifications.

Likewise, certain gaming applications, particularly 3D gaming applications that store large datasets for a given area to be selectively viewed "up close" may not require the same level of rendering precision when viewed "from afar". By systematically converting vertorized datasets for each area into respective magnification-appropriate static tile images, to be optionally used as dynamic mappings of this dataset, a rendering load may be drastically reduced thus improving overall image and game processing efficiencies.

Similarly, various medical data and/or imaging applications may rely on large vectorized dataset, their rendering efficiency of which may be drastically improved by implementing a computerized method as described herein. Other applications may also be considered to provide a like effect, as will be appreciated by the skilled artisan.

In some embodiments, the static tile images may be colour-coded based on one or more operational parameters or characteristics associated with selected dataset features. For example, returning to the IC layout example, extracted features associated with a particular IC layer may all share a same layer identifier and thus, invoke a same static tile image colouring allowing static tile images representative of different IC layout layers to show extracted features in respective layer-specific colours. In the context of bitmap tiles, each tile may still represent tile pixels in a binary format to locate the position of extracted features, and invoke appropriate layer-specific colouring upon rendering by applying a uniform colour code to the bitmap image based on an associate layer identifier. Multicolour bitmaps may also be considered, for example, when associating distinguishing parameters to selected features, such as those characterized by a power connection, or the like, so that they may be distinguishably rendered during verification.

With reference now to FIGS. 3 to 5B, an exemplary impact of the processes described herein will now be illustrated with reference to various sample IC layout images. In the below examples, a 1920×1080 screen resolution is assumed in providing sample calculations.

The extracted IC layout image shown in FIG. 3 represents an area of about 17500 pixels by 8200 pixels and contains over 11500 polygons that add up to about 1.9 MB of stored data. Using a standard polygon rendering process, 1.9 MB of data would thus have to be rendered to output this image using the stored polygons.

In comparison, the bitmap conversion and rendering processes described herein can allow for a significant reduction in data rendering load. For example, a set of 1024 pixel×1024 pixel bitmap tiles can be generated from the extracted polygons, each tile representing 1 bit per image pixel thus each invariably representing 128 KB in size on disk. At any given time, the user could render a maximum of 9 tiles (9×128 KB=1152 KB) which generally represents much less data than if the full size underlying polygons were used. In this example, a bitmap (.bmp) file format is considered, which does not involve any data compression. A tagged image file format (.tif) could also be considered to provide a similar advantage. On the other hand, the use of a compressed image file format such as jpeg (.jpg) could further improve performance, particularly when dealing with relatively small image files such as considered herein in which compression and decompression cycles do not add much load to the system. Accordingly, the herein-reported rendering load improvements figures may be further improved upon by considering one or more compressed image file formats, for example.

Using this approach, rendering the image view shown in FIG. 3 using bitmap tiles could be accomplished using between 0.125 MB and 1.125 MB depending on how the bitmap tiles are positioned in respect to this view. Accordingly, the use of bitmap tiles results in a rendering load of between 6.6% and 59% as compared to that required for full polygon rendering.

As will be appreciated by the skilled artisan, the rendering load savings will vary as the user zooms in and out, and in some embodiments, the system may be adapted to selectively render converted bitmap tiles or full polygons depending the selected viewing resolution (e.g. full polygons could be rendered when users select certain viewing magnifications beyond a preset magnification threshold.

Figure 4:
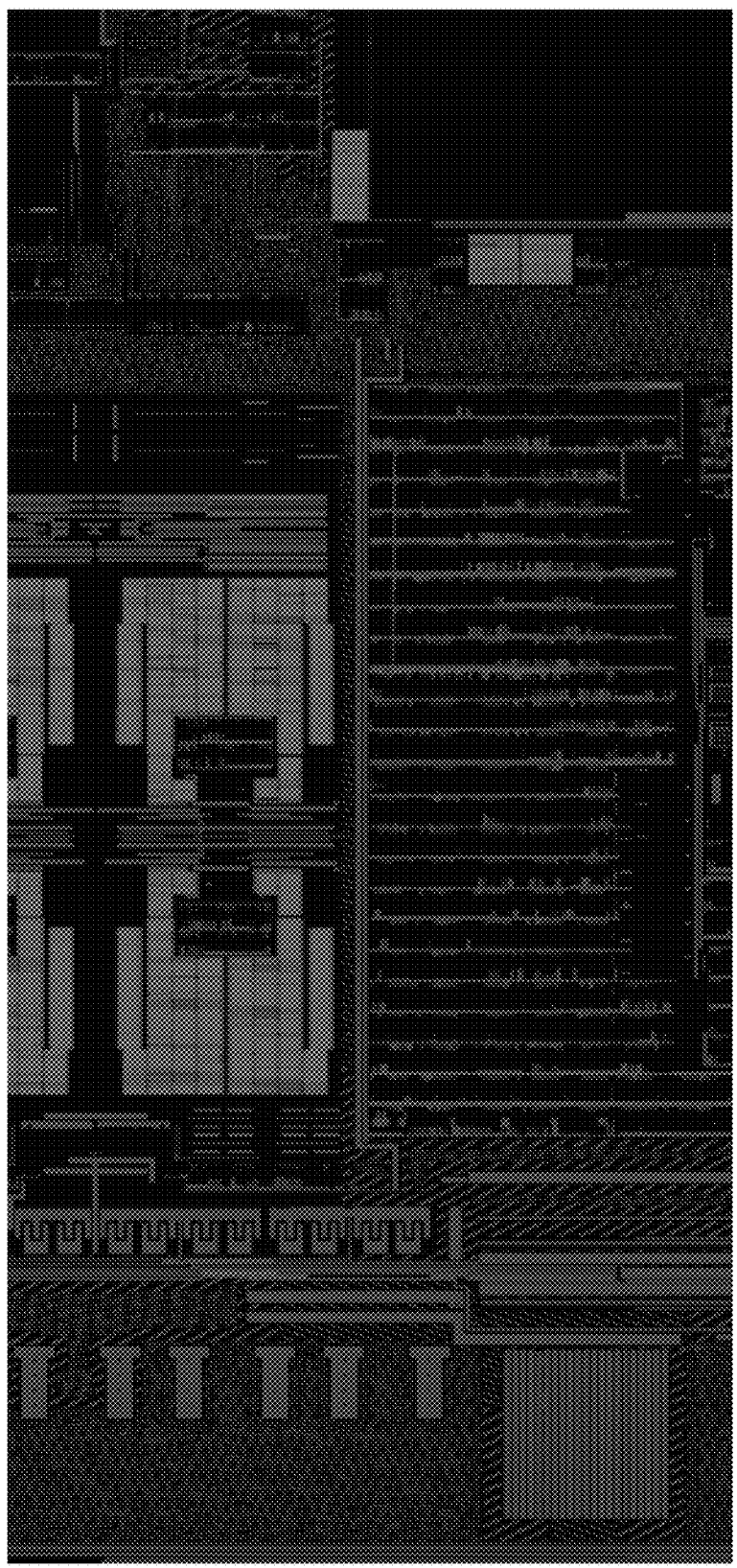
FIG. 4 is another exemplary screenshot of an automatically extracted IC circuit layout image consisting of 255000 polygons representing about 49 MB of stored data.

The extracted IC layout image shown in FIG. 4 represents an area of about 111400 pixels by 52000 pixels and contains over 255000 polygons that add up to about 49 MB. To render this view using polygons, one would need to load that much data and at this zoom level, many of the rendered polygons are not even visible. In comparison, to render the same view using bitmaps, one would need at most 1152 KB (1.125 MB) as stated above, which is about 2.3% of the 49 MB required if using polygons, which ratio gets smaller and smaller as the rendered view is zoomed out further and further to encompass visualization of even greater numbers of extracted polygons.

As noted above, the significant and increasing amount of data required to render a given view using polygons as one zooms out can be explained by two main factors. First, rendering using polygons requires loading every single polygon present in the view irrespective of viewing magnification, which means that for lower magnifications, a significant number of polygons may be rendered without necessarily being visually distinguishable by the user.

Secondly, imperfections generated during the data extraction process (chip delayering, imaging, polygon generation, etc.) can cause the generation of significantly more polygon vertices than would otherwise be required to render the same extracted image under ideal conditions, which are not generally available in a reverse engineering context. These somewhat superfluous polygon vertices thus result in larger polygon storage sizes and rendering loads. Namely, the size on disk of any given polygon increases with the number of its constituent vertices, each vertex being made of two integers that represent its coordinates with each integer being represented by 32 bits.

In comparison, and in accordance with one embodiment, bitmap images can be computed for different preset resolutions such that the rendering system can use at most 1 bit per screen pixel when rendering a given view no matter the zoom level. Accordingly, the amount of data required to render any given view using bitmap images will not depend on the zoom level, and only those features perceptively distinguishable on screen will be displayed to the user (as opposed to rendering visually undistinguishable and thus perceptively overlapping polygons).

Figure 5A:
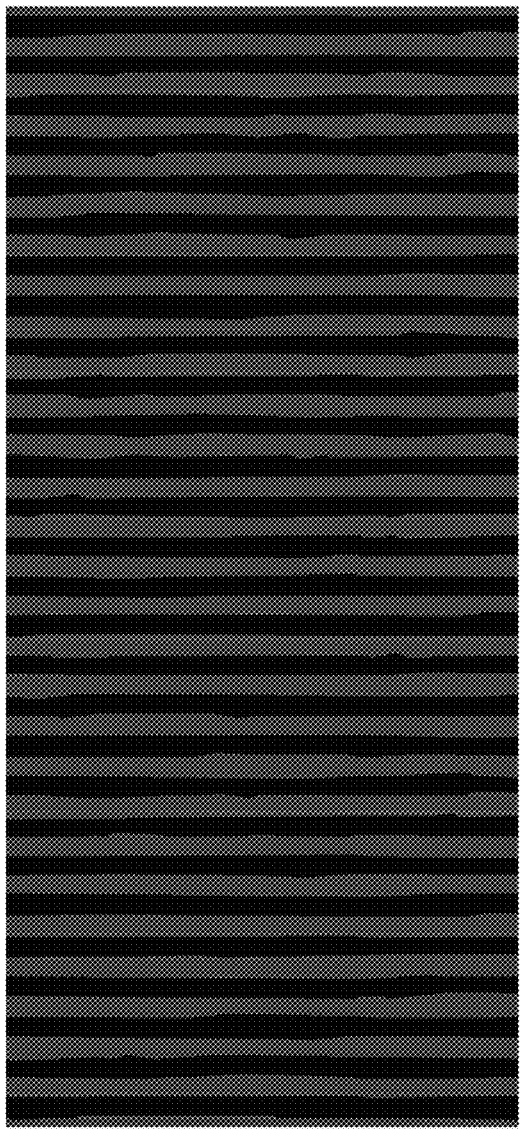

The extracted IC layout image shown in FIG. 5A illustrates the impact data extraction imperfections can have on rendering load. If the data extraction were flawless, the image shown in FIG. 5A would show perfectly straight lines, each one ideally defined by 5 polygon vertices. In comparison, actual reverse engineer imaging data extractions resulted in the production of the jagged lines shown here, each one, on average, defined by 60 polygon vertices, a twelve-fold increase from ideal imaging.

Figure 5B:
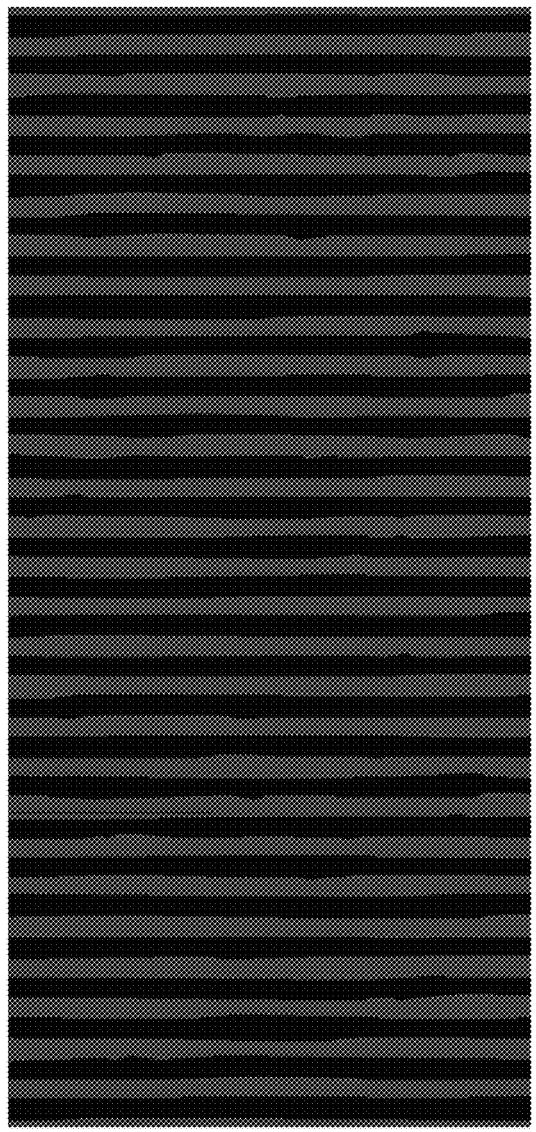
FIG. 5B is a screenshot of the same IC circuit layout image once converted from extracted polygons into a bitmap image to reduce rendering loads.

In FIG. 5B, the same extracted image is rendered using a bitmap conversion process, as described above, to produce a visually indistinguishable version of the same image, but without the added rendering load imparted by the extracted imperfections (i.e. the bitmap images are impartial to imperfections, allocating a single bit per viewing pixel whether this pixel is imaged as being within or outside a particular image feature).

While the present disclosure describes various exemplary embodiments, the disclosure is not so limited. To the contrary, the disclosure is intended to cover various modifications and equivalent arrangements included within the general scope of the present disclosure.

What is claimed is:

1. A computer-implemented method for verifying extracted integrated circuit (IC) features representative of a source IC and stored in a feature dataset structure, the method comprising:
   converting, from the feature dataset structure, a set of extracted IC features imaged within a designated IC area into a static tile image of said set representative of said area;
   rendering said static tile image for visualization as an interactive mapping of said feature dataset structure within said area;
   receiving input corrections for one or more of said set of extracted IC features based on said static tile image; and
   executing said input corrections on said feature dataset structure to produce an updated feature dataset structure.

2. The method of claim 1, further comprising prior to said converting:
   imaging the source IC to output a source IC image;
   automatically extracting a plurality of IC features from said source IC image; and
   storing respective representations of each of the extracted IC features in the feature dataset structure.

3. The method of claim 1, wherein:
   said converting comprises converting respective sets of the extracted IC features imaged within juxtaposed areas into corresponding juxtaposable static tile images; and
   said rendering and said receiving are executed as a function of said corresponding static tile images.

4. The method of claim 3, wherein adjacent ones of said juxtaposable static tile images are selectively mosaicked to render a combined interactive mapping.

5. The method of claim 4, wherein each of said corresponding static tile images is stored at multiple mapping resolutions such that, for a selected IC mapping area and resolution, corresponding ones of said juxtaposable static tile images are mosaicked to render said combined interactive mapping for said area at said mapping resolution.

6. The method of claim 5, wherein lower resolution tile images are constrained by virtue of their selected resolution to detail only larger scale IC features, whereas higher resolution tile images detail smaller scale IC features, and wherein said rendering comprises selectively rendering said interactive mapping at a selected resolution so to selectively constrain said rendering to said larger scale IC features.

7. The method of claim 1, further comprising converting said updated feature dataset into an updated static tile image and rendering said updated static tile image for further visualization as an updated interactive mapping of said updated feature dataset.

8. The method of claim 1, wherein said extracted IC features are stored as polygons in said feature dataset structure, and wherein said static tile image is representative of said polygons in said area.

9. The method of claim 1, wherein said static tile image is colour coded as a function of at least one IC feature characteristic stored against said extracted IC features in said feature dataset structure, wherein said at least one feature characteristic comprises at least one of an extracted feature layer identifier representative of a designated imaged IC layer or a power connection identified for at least some of said extracted IC features.

10. The method of claim 1, wherein said converting comprises generating a bitmap image representative of said extracted IC features in said area.

11. The method of claim 10, wherein said bitmap image is subsequently colour-coded as a function of at least one feature characteristic stored against said extracted IC features in said area.

12. The method of claim 1, wherein said rendering comprises at least partially transparently overlaying said static tile image onto a corresponding source IC image area such that said source IC image area is at least partially visible through said mapping.

13. An integrated circuit (IC) extraction verification system comprising:
   a user-interactive digital image display;
   a data processor; and
   a data storage accessible to said data processor, said data storage having stored therein:
      a feature dataset structure for storing extracted IC features representative of a source IC; and
      statements and instructions executable by said processor to:
         convert, from said feature dataset structure, a set of extracted IC features imaged within a designated IC area into a static tile image of said set representative of said area;
         render, on said display, said static tile image for visualization as an interactive mapping of said feature dataset structure within said area;
         receive input corrections for one or more of said set of extracted IC features based on said static tile image; and
         execute said input corrections on said feature dataset structure to produce an updated feature dataset structure.

14. The system of claim 13, wherein said statements and instructions are further executable to convert respective sets of the extracted IC features imaged within juxtaposed areas into corresponding juxtaposable static tile images, wherein adjacent ones of said juxtaposable static tile images are selectively mosaicked to render a combined interactive mapping.

15. The system of claim 14, wherein each of said corresponding static tile images is stored at multiple mapping resolutions such that, for a selected IC mapping area and resolution, corresponding ones of said juxtaposable static tile images are mosaicked to render said combined interactive mapping for said area at said mapping resolution.

16. The system of claim 15, wherein lower resolution tile images are constrained by virtue of their selected resolution to detail only larger scale IC features, whereas higher resolution tile images detail smaller scale IC features, and wherein said statements and instructions are further executable to selectively render said interactive mapping at a selected resolution so to selectively constrain said rendering to said larger scale IC features.

17. The system of claim 13, wherein said statements and instructions are further executable to convert said updated feature dataset into an updated static tile image and render said updated static tile image for further visualization as an updated interactive mapping of said updated feature dataset.

18. The system of claim 13, wherein said extracted IC features are stored as polygons in said feature dataset structure, and wherein said static tile image is representative of said polygons in said area.

19. The system of claim 13, wherein said static tile image is colour coded as a function of at least one IC feature characteristic stored against said extracted IC features in said feature dataset structure, wherein said at least one feature characteristic comprises at least one of an extracted feature layer identifier representative of a designated imaged IC layer or a power connection identified for at least some of said extracted IC features.

20. The system of claim 13, wherein static tile image is a bitmap image representative of said extracted IC features in said area, wherein said statements and instructions are further executable to colour-code said bitmap image as a function of at least one feature characteristic stored against said extracted IC features in said area.

21. The system of claim 13, wherein said statements and instructions are further executable to at least partially transparently overlay said static tile image onto a corresponding source IC image area such that said source IC image area is at least partially visible through said mapping.

22. A non-transitory computer-readable medium having statements and instructions stored thereon for execution by a processor to implement an integrated circuit (IC) feature extraction verification application by:
   converting, from a stored feature dataset structure, a set of extracted IC features imaged within a designated IC area into a static tile image of said set representative of said area;
   rendering, on an interactive digital display, said static tile image for visualization as an interactive mapping of said feature dataset structure within said area;
   receiving input corrections for one or more of said set of extracted IC features based on said static tile image; and
   executing said input corrections on said feature dataset structure to produce an updated feature dataset structure.

23. The computer-readable medium of claim 22, wherein:
   said converting comprises converting respective sets of said extracted IC features imaged within juxtaposed areas into corresponding juxtaposable static tile images;
   said rendering and said receiving are executed as a function of said corresponding static tile images;
   adjacent ones of said juxtaposable static tile images are selectively mosaicked to render a combined interactive mapping; and
   each of said corresponding static tile images is stored at multiple mapping resolutions such that, for a selected IC mapping area and resolution, corresponding ones of said juxtaposable static tile images are mosaicked to render said combined interactive mapping for said area at said mapping resolution.

24. The computer-readable medium of claim 23, wherein lower resolution tile images are constrained by virtue of their selected resolution to detail only larger scale IC features, whereas higher resolution tile images detail smaller scale IC features, and wherein said rendering comprises selectively rendering said interactive mapping at a selected resolution so to selectively constrain said rendering to said larger scale IC features.

25. The computer-readable medium of claim 22, wherein said extracted IC features are stored as polygons in said feature dataset structure, and wherein said static tile image is representative of said polygons in said area.

26. A computer-implemented method for rendering an image defined by a vectorized feature dataset at different magnifications, the method comprising:
- converting, for each given image rendering magnification, respective subsets of the vectorized feature dataset located within juxtaposed image areas into correspondingly juxtaposable static tile images of said respective subsets, wherein a resolution of each of said static tile images is prescribed by said given image rendering magnification;
- receiving selection of a selected image rendering magnification and selected image area;
- retrieving said static tile images corresponding to said selected image rendering magnification and selected image area; and
- rendering said retrieved static tile images for visualization of said selected image area at said selected image rendering magnification.

27. The method of claim 26, wherein lower magnification tile images are constrained by virtue of their associated magnification to detail only larger scale features, whereas higher magnification tile images detail smaller scale features, and wherein said rendering comprises selectively rendering said selected image area at a relatively higher selected magnification so to selectively constrain said rendering to said larger scale features.

28. The method of claim 26, wherein said vectorized features are stored as polygons, wherein said static tile images are representative of said polygons, and wherein said converting comprises generating a bitmap image representative of said vectorized features in said given area.

29. The method of claim 26, wherein said rendering comprises rendering said retrieved static tile images for visualization as an interactive mapping of said feature dataset structure within said area; and wherein the method further comprises receiving input corrections for one or more given features based on said static tile images; and executing said input corrections on said feature dataset to produce an updated feature dataset.

* * * * *